United States Patent [19]
Sugimoto et al.

[11] Patent Number: 5,592,365
[45] Date of Patent: Jan. 7, 1997

[54] PANEL ASSEMBLY STRUCTURE AND PANEL ASSEMBLING METHOD CAPABLE OF ACHIEVING A HIGHLY RELIABLE CONNECTION OF ELECTRODE TERMINALS EVEN WHEN THE ELECTRODE TERMINALS HAVE A FINE PITCH

[75] Inventors: Takayuki Sugimoto, Shiki-gun; Yasunobu Tagusa, Ikoma; Hisao Kawaguchi, Nara, all of Japan

[73] Assignee: Sharp Kabushiki Kaisha, Osaka, Japan

[21] Appl. No.: 360,018

[22] Filed: Dec. 20, 1994

[30] Foreign Application Priority Data

Dec. 21, 1993 [JP] Japan .................. 5-322792
Aug. 25, 1994 [JP] Japan .................. 6-200543

[51] Int. Cl.$^6$ .............. H05K 1/11; H05K 1/14; H01R 23/68; H01R 23/72
[52] U.S. Cl. .............. 361/789; 174/254; 361/749; 361/767; 361/769; 361/771; 361/773; 361/774; 361/776; 361/779; 361/784; 361/787; 361/790; 439/66; 439/91
[58] Field of Search .................. 174/250, 254, 174/255, 259, 88 R, 84 R, 94 R; 29/841, 855; 257/723, 724, 783; 228/180.1, 180.21, 180.22; 361/760, 767, 768, 769, 770, 771, 779, 749, 789, 790, 803; 156/324.4–338; 437/211; 439/66, 67, 77, 84, 86, 87, 91

[56] References Cited

U.S. PATENT DOCUMENTS

| | | | |
|---|---|---|---|
| 3,795,047 | 3/1974 | Abolafia et al. | 156/325 |
| 4,744,850 | 5/1988 | Imano et al. | 156/325 |
| 5,001,302 | 3/1991 | Atsumi | 174/94 R |
| 5,180,888 | 1/1993 | Sugiyama et al. | 174/94 R |
| 5,434,452 | 7/1995 | Higgins, III | 257/730 |

FOREIGN PATENT DOCUMENTS

| | | | |
|---|---|---|---|
| 3-27543 | 2/1991 | Japan | 257/730 |
| 592179 | 1/1993 | Japan . | |
| 5226422 | 3/1993 | Japan . | |
| 567480 | 9/1993 | Japan . | |
| 5251510 | 9/1993 | Japan . | |

*Primary Examiner*—Donald A. Sparks

[57] ABSTRACT

There is provided a display panel assembly structure capable of achieving a highly reliable connection even when fine-pitch electrode terminals are employed. A second electrode terminal is embedded in a flexible printed circuit board, and protrudes slightly from the flexible printed circuit board within a range of 0 to $2\times10^{-3}$ mm. By embedding the second electrode terminal in the flexible printed circuit board, an apparent thickness of the second electrode terminal is reduced while keeping the rigidity of the second electrode terminal to thereby improve etching accuracy of a top surface thereof. With the reduction of the protrusion amount of the second electrode terminal, a ratio of a thickness of an anisotropic conductive film to a diameter of a conductive particle can be made to be approximately "1". With the above-mentioned arrangement, the flow of the conductive particles is suppressed to prevent the possible reduction in amount of the conductive particles between a first electrode terminal and the second electrode terminal and further prevent the conductive particles from flowing into a space portion between adjoining first and second electrode terminals. A highly reliable connection between the panel having the fine-pitch electrode terminals and a circuit board can be achieved.

26 Claims, 13 Drawing Sheets

Fig. 16A

| Terminal protrusion amount H (mm) | Particle amount N in anisotropic conductive film (pieces/mm$^2$) | | | | |
|---|---|---|---|---|---|
| | 1000 | 2000 | 3000 | 4000 | 5000 |
| $1 \times 10^{-3}$ | 7.5 | 10.7 | 13.1 | 15.1 | 16.9 |
| $5 \times 10^{-3}$ | 7.1 | 10.0 | 12.3 | 14.2 | 15.9 |
| $10 \times 10^{-3}$ | 6.5 | 9.2 | 11.3 | 13.1 | 14.6 |
| $15 \times 10^{-3}$ | 6.0 | 8.4 | 10.3 | 11.9 | 13.3 |

Fig. 16B

| Terminal protrusion amount H (mm) | Particle amount N in anisotropic conductive film (pieces/mm$^2$) | | | | |
|---|---|---|---|---|---|
| | 1000 | 2000 | 3000 | 4000 | 5000 |
| $1 \times 10^{-3}$ | 4.6 | 6.7 | 8.0 | 9.2 | 10.3 |
| $5 \times 10^{-3}$ | 4.2 | 5.9 | 7.2 | 8.3 | 9.3 |
| $10 \times 10^{-3}$ | 3.6 | 5.0 | 6.2 | 7.1 | 8.0 |
| $15 \times 10^{-3}$ | 2.9 | 4.2 | 5.1 | 5.9 | 6.6 |

PANEL ASSEMBLY STRUCTURE AND PANEL ASSEMBLING METHOD CAPABLE OF ACHIEVING A HIGHLY RELIABLE CONNECTION OF ELECTRODE TERMINALS EVEN WHEN THE ELECTRODE TERMINALS HAVE A FINE PITCH

BACKGROUND OF THE INVENTION

1. Field of the Invention

The present invention relates to a panel assembly structure in which electrode terminals of a panel are connected with electrode terminals of a flexible printed circuit board via an anisotropic conductive film and method for assembling the panel, and in particular, to a display panel assembly structure employing an electroluminescence device, plasma, liquid crystals, or the like.

2. Description of the Prior Art

Conventionally, electrode terminals of a panel have been connected with electrode terminals of a flexible printed circuit board in a manner as follows.

Referring to FIG. 20 which is a sectional view of a panel and a flexible printed circuit board and FIG. 21 (a sectional view taken along the line 21—21 in FIG. 20), electrode terminals 4 on a flexible printed circuit board 2 mounted with a drive IC (integrated circuit) 1 have been connected with electrode terminals 7 on a panel 8 by a thermocompression bonding method with interposition of an anisotropic conductive film 6 which has a film thickness b ($20 \times 10^{-3}$ mm to $30 \times 10^{-3}$ mm) much greater than a diameter d ($8 \times 10^{-3}$ mm to $10 \times 10^{-3}$ mm) of a conductive particle 5 (i.e., b>>d) and includes several conductive particles 5 in the direction of the thickness.

The electrode terminals 4 on the flexible printed circuit board 2 are formed to have a thickness a ($=18 \times 10^{-3}$ mm or more) by sticking a copper sheet onto the flexible printed circuit board 2 via a reinforcing adhesive sheet 3 and etching the copper sheet.

The flexible printed circuit board 2 having the fine-pitch electrode terminals is connected with the panel 8 having the fine-pitch electrode terminals, and then the conductive particles 5 in the anisotropic conductive film 6 are peripherally coated with insulating films 9. Then the insulating films 9 existing in the direction of the thickness of the anisotropic conductive film 6 (in the direction in which the electrode terminals are to be connected with each other) are peeled off by a pressure force exerted in connecting the electrode terminals 4 on the side of the flexible printed circuit board 2 with the electrode terminals 7 on the side of the panel 8 in the thermocompression bonding process, with which both the electrode terminals 4 and 7 are electrically connected with each other.

The following two factors can be enumerated as factors required in connecting the fine-pitch electrode terminals with each other.

(1) An improvement in etching accuracy of the top surfaces of the electrode terminals 4 in forming the electrode terminals 4 by etching on the flexible printed circuit board 2 to be mounted with the drive IC 1.

(2) Ensuring of a required amount of conductive particles 5 existing between each electrode terminal 7 on the side of the panel 8 and each electrode terminal 4 on the side of the flexible printed circuit board 2 in the thermocompression bonding process.

The following provides a review on the conventional method for connecting the panel 8 having the electrode terminals 7 with the flexible printed circuit board 2 having the electrode terminals 4.

Firstly, the etching accuracy of the top surface of the electrode terminal 4 deteriorates as the thickness a of the electrode terminal 4 to be etched increases. Therefore, in order to improve the etching accuracy, the thickness a of the electrode terminal 4 is required to be reduced. However, if the thickness a of the electrode terminal 4 is merely reduced, there is such a problem that the electrode terminal 4 may be bent or made to be easily broken by a stress applied in subsequently mounting the drive IC 1.

Secondly, the amount of the conductive particles 5 existing between both the electrode terminals 4 and 7 in the thermocompression bonding process depends on the rate of the existence of the conductive particles 5 between both the electrode terminals 4 and 7 just at the time when the conductive particles 5 existing in the anisotropic conductive film 6 are bonded to the electrode terminals in the thermocompression bonding process. In order to ensure a reliable connection strength, the anisotropic conductive film 6 is required to be sufficiently filled in each space portion between adjoining electrode terminals 4 and 4 on the side of the flexible printed circuit board 2. Therefore, the anisotropic conductive film 6 is required to have a film thickness corresponding to the thickness a of the electrode terminals 4 on the side of the flexible printed circuit board 2.

However, since the thickness a of the electrode terminals 4 is much greater than the conductive particle diameter d, the thickness of the anisotropic conductive film 6 is compelled to be much greater than the conductive particle diameter d. As a result, a resin portion of the anisotropic conductive film 6 flows actively in the thermocompression bonding process, with which the conductive particles 5 flow due to a stress generated when the resin flows. Consequently, the amount of the conductive particles 5 between the electrode terminals 4 and 7 is reduced to fail in ensuring the required amount of the conductive particles.

Also, there is such a problem that the conductive particles 5 which have been flown in the space portion between adjoining electrode terminals 4 and 4 on the side of the flexible printed circuit board 2 become agglomerate to be a cause of a current leak between the adjoining electrode terminals 4 and 4.

For the above-mentioned reasons, according to the method for connecting the panel 8 having the conventional electrode terminals 7 with the flexible printed circuit board 2, it is difficult to achieve a connection between electrode terminals having a fine pitch of not greater than $80 \times 10^{-3}$ mm.

In order to reduce the possible occurrence of current leak between adjoining electrode terminals 4 and 4, it can be considered to form an insulating film 9 around each conductive particle 5 in the anisotropic conductive film 6. However, in the above-mentioned case, the insulating film 9 is required to be peeled off by a pressure force in the thermocompression bonding process, and therefore the panel 8 may be destroyed by the pressure force in the process. Furthermore, it is possible that the insulating film 9 cannot be completely peeled off.

Furthermore, as shown in FIG. 22, there has been conventionally provided only an alignment mark 10 at an end portion of an array of the electrode terminals 4 on the flexible printed circuit board 2, and no special device has been provided to prevent the anisotropic conductive film 6 from flowing out in the thermocompression bonding process. Therefore, the anisotropic conductive film 6 flows out at the end portion of the flexible printed circuit board 2 in a manner as shown in FIG. 23 (corresponding to a section taken along the line 23—23 in FIG. 22), resulting in a degraded connection reliability.

SUMMARY OF THE INVENTION

Accordingly, it is an object of the present invention to provide a panel assembly structure and panel assembling method capable of achieving a highly reliable connection in connecting electrode terminals of a panel with electrode terminals of a flexible printed circuit board via an anisotropic conductive film even when the electrode terminals have a fine pitch.

A further object of the present invention is to provide a panel assembly structure capable of preventing the anisotropic conductive film from flowing out of an end portion of the flexible printed circuit board.

In order to achieve the aforementioned object, the present invention provides a panel assembly structure in which a first electrode terminal formed in a peripheral portion of one surface of a substrate of a panel is connected via an anisotropic conductive film with a second electrode terminal which is formed on a flexible printed circuit board mounted with a drive use integrated circuit for driving the panel and connected with the drive use integrated circuit, wherein a height of the second electrode terminal on the flexible printed circuit board from a surface of the flexible printed circuit board is set at a value of not greater than $10 \times 10^{-3}$ mm, and a film thickness of the anisotropic conductive film is set at a value approximately equal to an outer diameter of each conductive particle existing in the anisotropic conductive film.

Meanwhile, a third electrode terminal which is formed on the flexible printed circuit board and connected with the drive use integrated circuit is connected with a fourth electrode terminal of a wiring board for transmitting an external signal to the drive use integrated circuit via an anisotropic conductive film. The height of the third electrode terminal formed on the flexible printed circuit board from the surface of the flexible printed circuit board is set at a value of not greater than $10 \times 10^{-3}$ mm, and the film thickness of the anisotropic conductive film for use in connecting the third electrode terminal is set at a value approximately equal to an outer diameter of each conductive particle existing in the anisotropic conductive film.

With the above-mentioned construction, each of the second and third electrode terminals which are provided on the flexible printed circuit board mounted with the drive IC for driving the panel has its height from the surface of the flexible printed circuit board set at a very small value of $10 \times 10^{-3}$ mm, and the top surfaces of the second and third electrode terminals have a very high etching accuracy. Then the second and third electrode terminals on the side of the flexible printed circuit board are connected respectively with the first electrode terminal formed in the peripheral portion on the one surface of the panel and the fourth electrode terminal of the wiring board for transmitting an external signal to the drive IC via the anisotropic conductive film of which film thickness is set at a value approximately equal to the outer diameter of each conductive particle. Therefore, the conductive particles of the anisotropic conductive film do not flow in the thermocompression bonding process, with which an amount of conductive particles required for conduction can be ensured between the first and fourth electrode terminals on the side of the panel or the wiring board and the second and third electrode terminals on the side of the flexible printed circuit board.

Thus the connections between the panel and the flexible printed circuit board, and between the flexible printed circuit board and the wiring board are achieved with high reliability even when the electrode terminals have a fine pitch of not greater than $80 \times 10^{-3}$ mm.

According to one embodiment, an area of a metal plating and an area of an insulating film on a plurality of second electrode terminals arranged in parallel with each other on the flexible printed circuit board are arranged in a checkered pattern. Therefore, the area of the metal plating and the area of the insulating film are alternately arranged between adjoining second electrode terminals, which prevents the possible occurrence of current leak due to the conductive particles of the anisotropic conductive film between the adjoining electrode terminals.

According to one embodiment, connection of the second electrode terminal on the flexible printed circuit board with the first electrode terminal on the panel, connection of the second electrode terminal on the flexible printed circuit board with a fifth electrode terminal of the drive use integrated circuit, connection of the third electrode terminal on the flexible printed circuit board with the fourth electrode terminal on the wiring board, and connection of the third electrode terminal on the flexible printed circuit board with a sixth electrode terminal of the drive use integrated circuit are each achieved in one process with interposition of an identical anisotropic conductive film.

According to a panel assembling method of one embodiment, each parameter important in connecting the electrode terminals having a fine pitch, e.g., the height (protrusion amount) of the second electrode terminal from the surface of the flexible printed circuit board is assumed to be H (mm). Further by taking into account a displacement amount Z (mm) between the panel and the flexible printed circuit board, it is assumed that the width of a portion where the first and second electrode terminals actually overlap each other in the lengthwise direction is L (mm), and the width i.e. connection width of the portion where the first and second electrode terminals actually overlap each other in a direction perpendicular to the lengthwise direction is D (mm) when the electrode terminals are connected with each other. It is further assumed that the amount of conductive particles existing in a unit area of the anisotropic conductive film is N (pieces/mm$^2$).

Assuming that the amount of conductive particles of the anisotropic conductive film existing within an area D·L where the first and second electrode terminals actually overlap each other when the electrode terminals are connected with each other is n (pieces), it has been discovered from a variety of experiments that the following equation:

$$n = \alpha(\beta H + 1) \cdot N^{1/2} \cdot D \cdot L \tag{1}$$

holds (where $\alpha$ and $\beta$ are constants depending on such conditions as the material characteristics of the anisotropic conductive film, a pressure force in the connecting process, and a temperature).

According to Equation (1), each parameter is set through the following procedure.

(1) First of all, between the connection error (displacement amount) Z, the pitch P (mm) of the plural number of first electrode terminals arranged in parallel with each other, the connection width D in the direction perpendicular to the lengthwise direction (the direction referred to as a "pitchwise direction" hereinafter), and a minimum insulation width S (a minimum value of the distance between an edge of one first electrode terminal on the side of the panel and a second electrode terminal on the side of the flexible printed circuit board corresponding to the first electrode terminal adjacent to the one first electrode terminal), a relational expression:

$$Z=[P-(D+S)]/2 \quad (3)$$

holds according to a geometrical relationship.

In the above case, the connection error Z depends on a mechanical error of an automatic connecting apparatus and other factors. The pitch P is determined to be, for example, $P=50\times10^{-3}$ mm as an intended specification of the panel. The minimum insulation width S depends on the resin characteristics of the anisotropic conductive film 17. Therefore, the minimum connection width D in the pitchwise direction is determined according to Equation (3).

(2) In order to achieve the fine pitch P, the amount n of conductive particles existing in the connection area D·L (connection use conductive particle amount) serves as an important parameter. According to the results of a variety of experiments, there has been found that the connection use conductive particle amount n capable of ensuring a high reliability is not less than five (preferably not less than ten). Therefore, it is required for the connection use conductive particle amount n to be not less than a specified amount (five, for example) even in the case of the minimum connection width D due to the occurrence of displacement.

(3) The values $\alpha$ and $\beta$ in Equation (1) have variations due to a statistical error. Therefore, taking the variations into account, the values of H and N are determined so that the connection use conductive particle amount n can be not less than the above-mentioned specified amount. With the above-mentioned arrangement, the required connection use conductive particle amount n can be ensured.

Then the thickness t of the anisotropic conductive film for the connection use is determined.

It is assumed that the anisotropic conductive film has a uniform thickness t before it is used for the connection. It is further assumed that the anisotropic conductive film has a thickness $t_0$ after it is used for the connection between the first electrode terminal with the second electrode terminal.

Assuming that the distance between edges of the top surfaces of adjoining second electrode terminals on the surface of the flexible printed circuit board is $I_1$, and the distance between the adjoining second electrode terminals on the surface is $I_2$, then a relational expression:

$$t=(I_1+I_2)\cdot H/(2\cdot P)+t_0+\gamma \quad (2)$$

holds (where $\gamma$ is a constant depending on such conditions as the material characteristics of the anisotropic conductive film, a pressure force in the connecting process, and a temperature) according to a geometrical relationship. By substituting the already set protrusion amount H into Equation (2), a set value of t is determined.

With the above-mentioned arrangement, the flow of the resin of the anisotropic conductive film can be suppressed to the necessary minimum value in the thermocompression bonding process. The above-mentioned arrangement can also prevent the possible occurrence of current leak due to the aggregation of the conductive particles 22 in the space portion between adjoining second electrode terminals. As a result, an improved connection reliability can be achieved even when the electrode terminals have a fine pitch.

According to the above-mentioned panel assembling method, the values of the constants $\alpha$, $\beta$, and $\gamma$ are set within the ranges of:

$0.015 \leq \alpha \leq 0.035$ (units: (pieces)$^{1/2}$/mm), $-0.005 \geq \beta \geq -0.025$ (units: 1/mm), and $0 \leq \gamma \leq 9.0$ (units: $10^{-3}$ mm), and therefore the parameters H and N in Equation (1) can be set depending on such actual conditions as the material characteristics of the practical anisotropic conductive film, a pressure force in the connecting process, and a temperature.

Furthermore, according to the panel assembling method of one embodiment, the value of n is set within the range of:

$5 \leq n$, and therefore the required amount of connection use conductive particle amount n can be ensured within the area D·L where the first and second electrode terminals actually overlap each other when they are connected with each other.

According to the panel assembly structure of one embodiment, a dummy electrode terminal which has an approximately bracket-shaped pattern and is opening toward the second electrode terminals while being in no correspondence with the first electrode terminal of the panel is provided beside an end portion of an array of the second electrode terminals of the flexible printed circuit board. With the above-mentioned arrangement, the resin of the anisotropic conductive film at the end portion of the flexible printed circuit board is prevented from flowing out in the connection process. Therefore, the anisotropic conductive film can be filled in a uniform thickness between the panel and the flexible printed circuit board to consequently allow the connection reliability to be improved.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIGS. 16A and 16B are tables of simulation results for determining parameters H and N in the panel assembly structure;

DETAILED DESCRIPTION OF THE PREFERRED EMBODIMENTS

Preferred embodiments of the present invention will now be described in detail with reference to the accompanying drawings.

Figure 1:
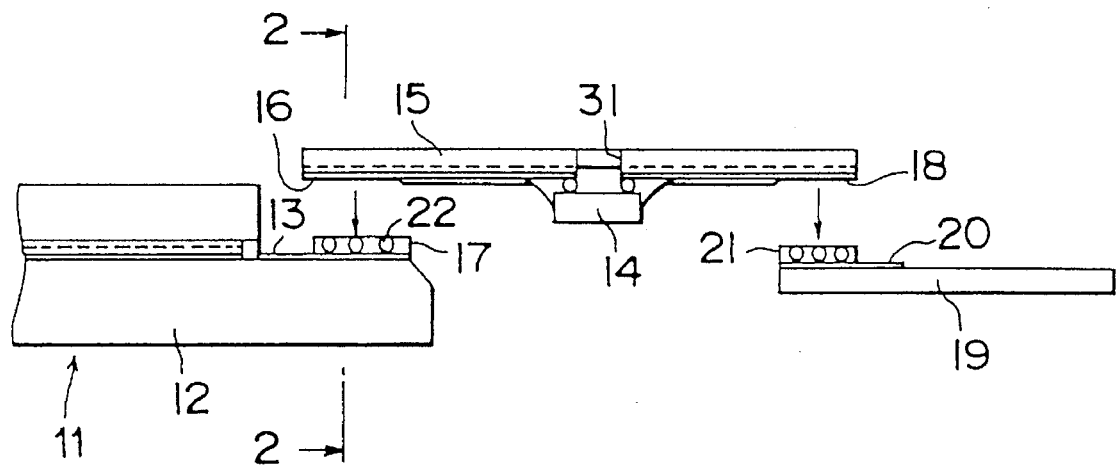
FIG. 1 is a sectional view of a panel and a flexible printed circuit board for implementing a panel assembly structure of the present invention.
Figure 2:
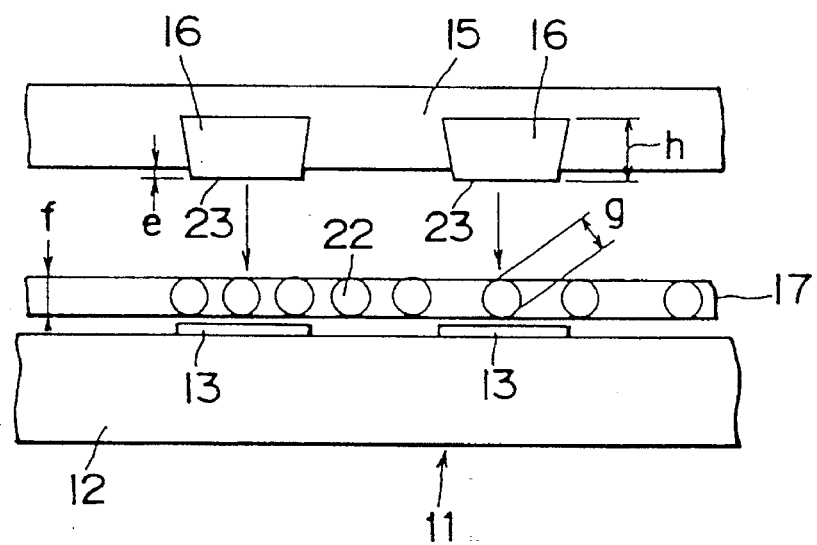
FIG. 2 is an enlarged sectional view taken along the line 2—2 in FIG. 1.

FIG. 1 is a sectional view of a panel and a flexible printed circuit board for implementing a panel assembly structure of the present invention. FIG. 2 is an enlarged sectional view taken along the line 2—2 in FIG. 1.

Referring to FIG. 1, a panel electrode terminal 13 which is a first electrode terminal formed on a glass substrate 12 of a panel 11 is connected with a second electrode terminal 16 formed on a flexible printed circuit board 15 mounted with a drive IC 14 via an anisotropic conductive film 17. Meanwhile, a third electrode terminal 18 formed on the flexible printed circuit board 15 is also connected with a fourth electrode terminal 20 formed on a wiring board 19 via an anisotropic conductive film 21, thereby allowing a signal to be supplied from the wiring board 19 to the drive IC 14 on the flexible printed circuit board 15.

The second electrode terminal 16 on the flexible printed circuit board 15 is formed while being embedded in the flexible printed circuit board 15 by the pressure connecting method or the like. In the above case, a thickness h of the second electrode terminal 16 is set at a value of not greater than $10 \times 10^{-3}$ mm, and a height (protrusion amount) e of the second electrode terminal 16 protruding from a surface of the flexible printed circuit board 15 is made to fall within a range of 0 to $2 \times 10^{-3}$ mm.

With the above-mentioned structure in which the second electrode terminal 16 is embedded in the flexible printed circuit board 15, an apparent thickness (i.e., the protrusion amount from the surface of the flexible printed circuit board 15) e of the second electrode terminal 16 can be reduced. Therefore, in reverse proportion to the reduction in thickness e of the second electrode terminal 16, the etching accuracy in forming a top surface 23 of the second electrode terminal 16 is improved. In the above case, since the second electrode terminal 16 has a sufficient actual thickness h of not greater than $10 \times 10^{-3}$ mm, that is to say, the second electrode terminal 16 possibly has a thickness h of approximately $10 \times 10^{-3}$ mm, the second electrode terminal 16 can sufficiently endure a stress generated in mounting the drive IC 14 on the flexible printed circuit board 15.

Furthermore, by reducing the height (protrusion amount) e of the second electrode terminal 16 from the surface of the flexible printed circuit board 15, the amount of resin which is to be filled in a space portion between adjoining second electrode terminals 16 and 16 for the purpose of ensuring a reliable connection strength can be reduced. As a result, a thickness f of the anisotropic conductive film 17 used for the connection with the panel 11 can be reduced.

Therefore, according to the present embodiment, a diameter g of each conductive particle 22 existing in the anisotropic conductive film 17 is set at a value of 1 to $3 \times 10^{-3}$ mm being sufficiently smaller than that in the conventional case, and the film thickness f of the anisotropic conductive film 17 is set so that a ratio (g/f) of the film thickness f to the diameter g of the conductive particle 22 is made to be approximately "1". Thus by setting the ratio (g/f) of the film thickness f to the diameter g of the conductive particle 22 at approximately "1", then the conductive particles 22 of the anisotropic conductive film 17 can not move in a direction perpendicular to the lengthwise direction of the second electrode terminal 16 in the thermocompression bonding process, with which the possible occurrence of the movement of the resin portion is eliminated. With the above-mentioned arrangement, the amount of the conductive particles 22 between the second electrode terminal 16 on the side of the flexible printed circuit board 15 and the first electrode terminal 13 on the side of the panel 11 is not reduced to ensure a required amount of particles for the conduction.

Furthermore, since the conductive particles 22 do not flow into the space portion between adjoining second electrode terminals 16 and 16 on the side of the flexible printed circuit board 15, a cause of the possible occurrence of current leak between the adjoining second electrode terminals 16 and 16 can be eliminated.

For the above-mentioned reasons, the connection between the panel having electrode terminals arranged at a pitch of not greater than $80 \times 10^{-3}$ mm with a circuit board, which has been impossible according to the conventional panel assembly structure, can be achieved.

In the present embodiment, the third electrode terminal 18 formed on the flexible printed circuit board 15 is also connected with the fourth electrode terminal 20 formed on the wiring board 19 via the anisotropic conductive film 21 in the same manner as in the case of the second electrode terminal 16. With the above-mentioned arrangement, the flexible printed circuit board 15 and the wiring board 19 are allowed to be connected with each other by way of the third and fourth electrode terminals 18 and 20 each having a fine pitch.

Figure 3:
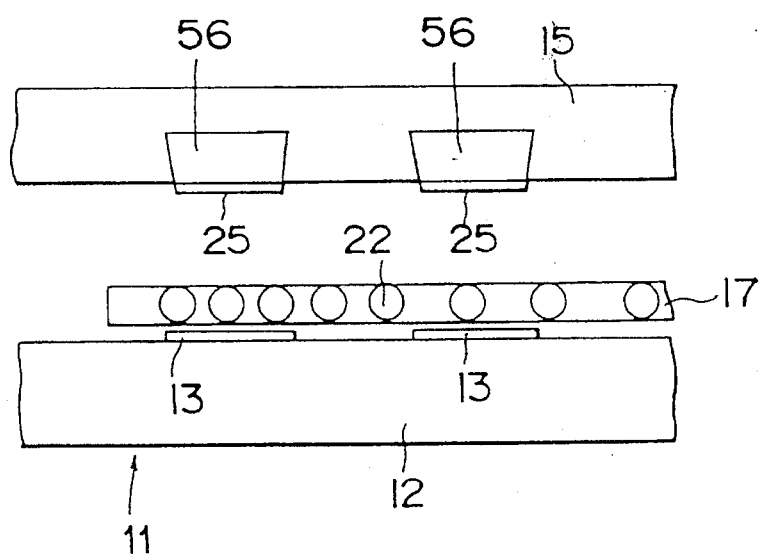
FIG. 3 is a sectional view of a flexible printed circuit board different from that of FIG. 2.

In an embodiment as shown in FIG. 3, protruding portions of second electrode terminals 56 embedded in the flexible printed circuit board 15 are all provided with a very thin metal plating 25 made of Sn, Ni, Au, solder, or the like (although not shown, the third electrode terminal is also provided with a metal plating in the same manner as in the case of the second electrode terminal). With the above-mentioned arrangement, the second and third electrode terminals 56 can be prevented from being oxidated.

The metal plating 25 provided on the second electrode terminals 56 on the flexible printed circuit board 15 may be provided entirely in the lengthwise direction of the second and third electrode terminals 56 (only the second electrode terminal is shown in FIG. 3). Otherwise, in a manner as shown in FIG. 4, only a connection portion C of the second and third electrode terminals 66 and 68 may be provided with the metal plating, and the portion other than the connection portion C may be covered with a resist film 30 in a manner as shown in FIG. 4.

Figure 4:
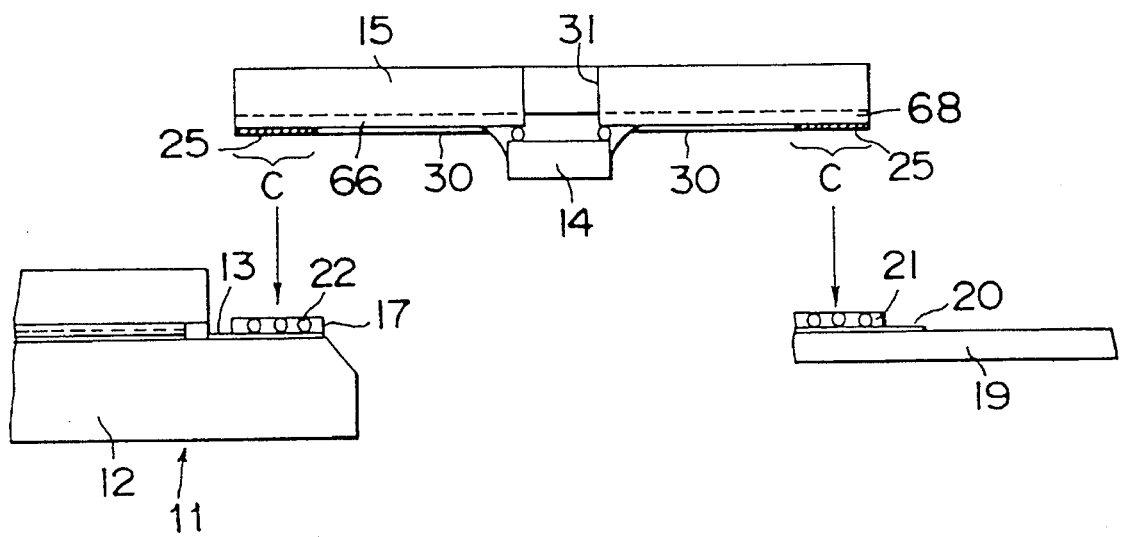
FIG. 4 is a sectional view of a panel and a flexible printed circuit board different from that of FIG. 1.
Figure 5:
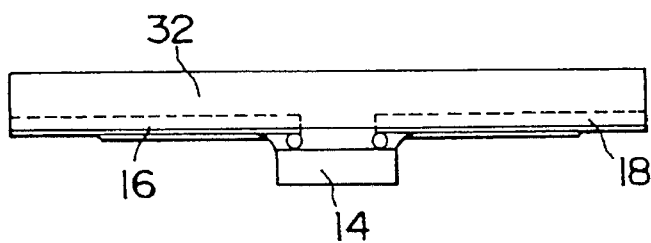
FIG. 5 is a sectional view of a flexible printed circuit board different from those of FIGS. 1 and 4.

The connection portion of the drive IC 14 at the flexible printed circuit board having the above-mentioned construction may be a type provided with a window 31 as shown in FIGS. 1 and 4, or a type provided with no window such as a flexible printed circuit board 32 as shown in FIG. 5.

Figure 6:
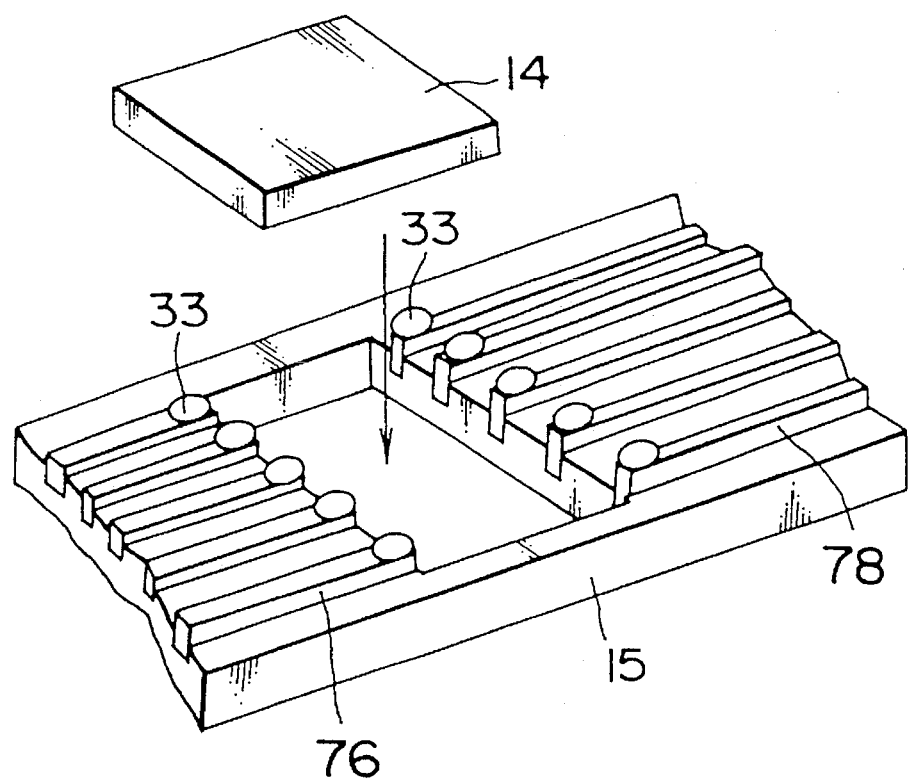
FIG. 6 is an explanatory view of a process of providing a bump on each electrode terminal on a flexible printed circuit board.
Figure 7:
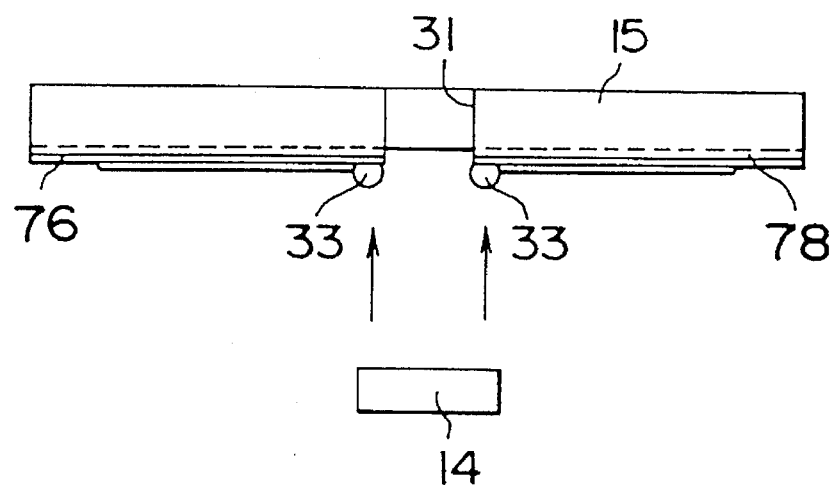
FIG. 7 is a sectional view of the flexible printed circuit board shown in FIG. 6.

Furthermore, in a manner as shown in FIGS. 6 and 7, it is also acceptable to provide bumps 33 at connection portions of the second and third electrode terminals 76 and 78 formed on the flexible printed circuit boards 15 and 32 to be connected with the drive IC 14.

Figure 8:
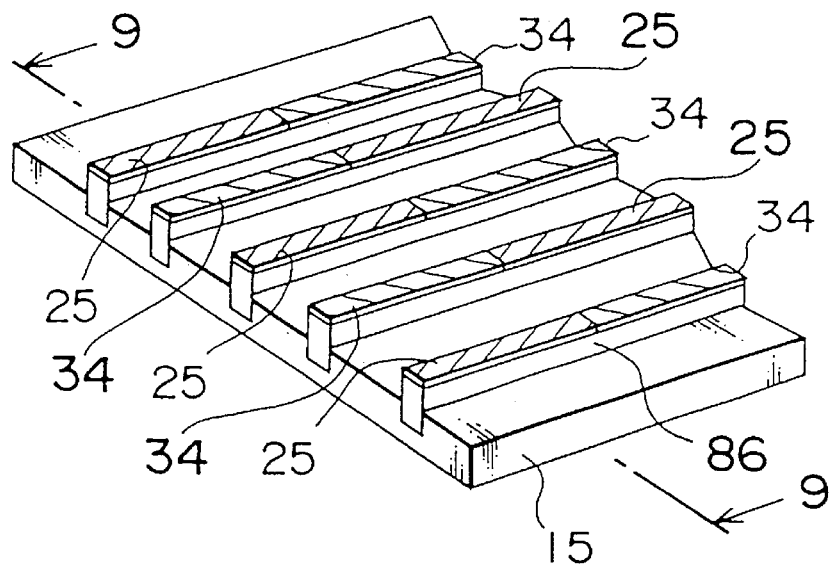
FIG. 8 is a perspective view of a part of flexible printed circuit board on which a metal plating and an insulating film are alternately formed in a checkered pattern on electrode terminals arranged in parallel with each other.
Figure 9:
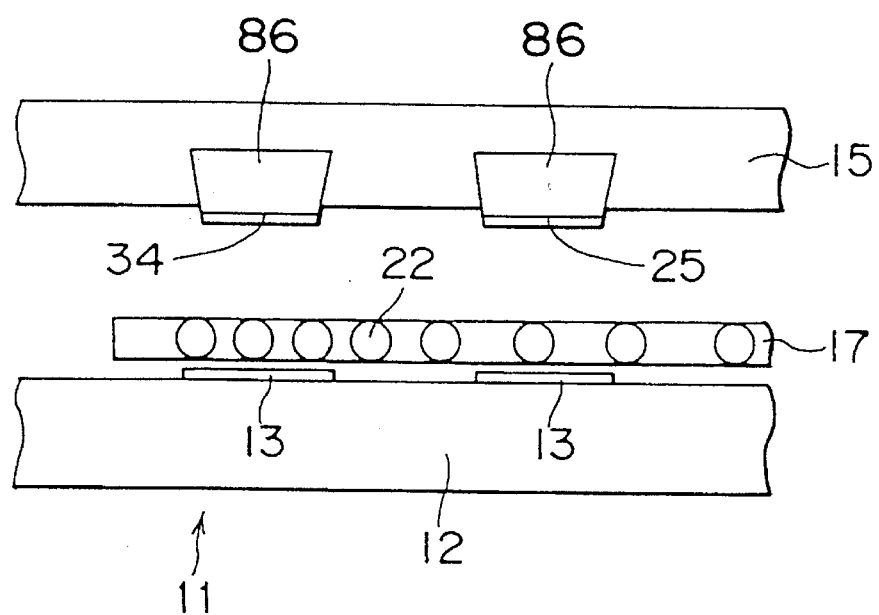
FIG. 9 is an enlarged sectional view taken along the line 9—9 in FIG. 8.

In an embodiment as shown in FIG. 8 and FIG. 9 (a sectional view taken along the line 9—9 in FIG. 8), top surfaces of the second and third electrode terminals 86 (only the second electrode terminal 86 is shown in FIGS. 8 and 9) embedded in the flexible printed circuit board 15 are provided with a metal plating 25 and an insulating film layer 34 having a thickness equal to the thickness of the metal plating 25 arranged alternately in the lengthwise direction of the electrode terminals. In the above case, the metal plating 25 and the insulating film layer 34 are arranged mutually reversely in position to be staggered between adjoining second electrode terminals 86 and 86 or adjoining third electrode terminals (not shown). In other words, when the flexible printed circuit board 15 is viewed from the side of the second electrode terminal 86, the metal plating 25 and the insulating film layer 34 exhibit a checkered pattern.

With the above-mentioned arrangement, the possible occurrence of current leak due to the conductive particles 22 (refer to FIG. 9) of the anisotropic conductive film between the adjoining second electrode terminals 86 and 86 or the adjoining third electrode terminals can be more surely prevented.

Figure 10:
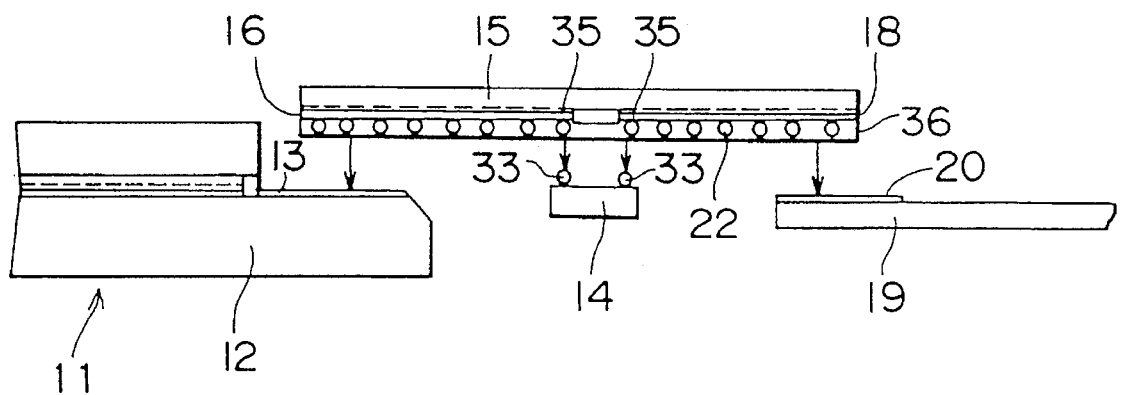
FIG. 10 is a sectional view of a panel and a flexible printed circuit board different from those of FIGS. 1, 4, 5, and 7.
Figure 11:
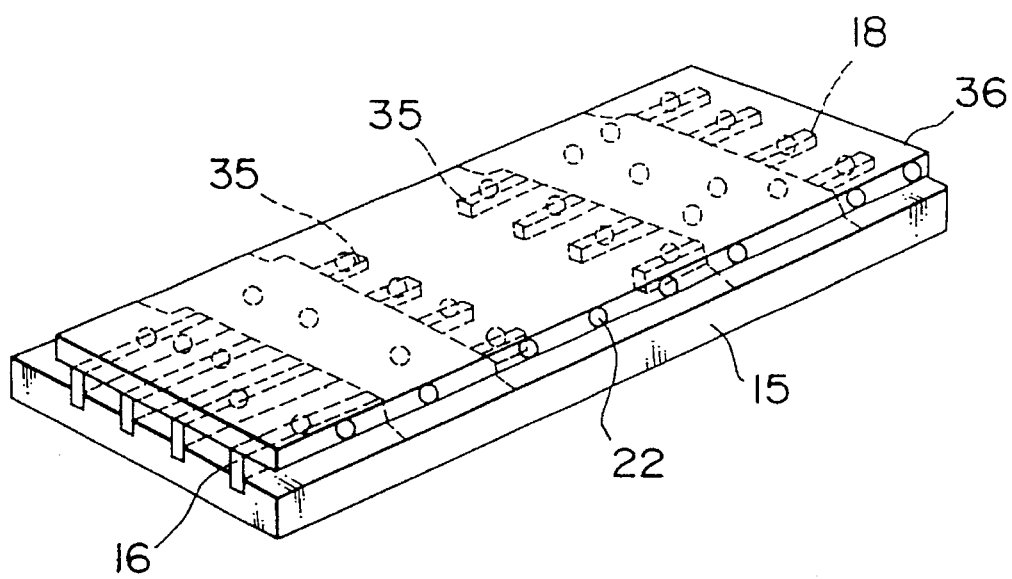
FIG. 11 is a perspective view of the flexible printed circuit board shown in FIG. 10.

In an embodiment as shown in FIG. 10 and FIG. 11 (an enlarged perspective view of the flexible printed circuit board 15 shown in FIG. 10), connection of the second electrode terminal 16 embedded in the flexible printed circuit board 15 with the electrode terminal 13 of the panel 11, connection of the third electrode terminal 18 embedded in the flexible printed circuit board 15 with the fourth electrode terminal 20 of the wiring board 19, and connection of the bumps 33 of the drive IC 14 with drive IC connecting electrode terminals 35 and 35 of the second and third electrode terminals 16 and 18 are achieved with interposition of an identical anisotropic conductive film 36. The bumps 33 and 33 serve as fifth and sixth electrode terminals.

With the above-mentioned arrangement, the connection of the second electrode terminal 16 with the first electrode terminal 13, the connection of the third electrode terminal 18 with the fourth electrode terminal 20, and the connection of the bumps 33 and 33 of the drive IC 14 with the drive IC connecting electrode terminals 35 and 35 can be achieved in one process to allow the reduction in number of processes.

Although the apparent thickness of the second and third electrode terminals 16 and 18, i.e., the height (protrusion amount) e of the electrode terminals from the surface of the flexible printed circuit board 15 is made to fall within a range of 0 to $2\times10^{-3}$ mm in each of the aforementioned embodiments, the aforementioned effects can be sufficiently obtained when the height (protrusion amount) e is not greater than $10\times10^{-3}$ mm.

Furthermore, in each of the aforementioned embodiments, the second and third electrode terminals 16 and 18 on the flexible printed circuit board 15 are formed while being embedded in the flexible printed circuit board 15 by the pressure connecting method or the like. However, the present invention is not limited to this, and it is acceptable to fill the space between the second electrode terminals 16 and 16 or the space between the third electrode terminals 18 and 18 at the second and third electrode terminals 16 and 18 formed on the substrate of the flexible printed circuit board 15 with an insulating film. What is essential is the fact that the second and third electrode terminals 16 and 18 are required to protrude from the flexible printed circuit board 15 by a height within the range of $10\times10^{-3}$ mm.

As apparent from the above description, according to the panel assembly structure of the present embodiment, the height of each of the electrode terminals which are provided on the flexible printed circuit board mounted with the drive IC for driving the panel and connected with the drive IC from the surface of the flexible printed circuit board is set at a value of not greater than $10\times10^{-3}$ mm. Therefore, the thickness of each of the electrode terminals protruding from the substrate surface of the board is remarkably reduced in comparison with the thickness in the conventional case to allow the etching accuracy of the top surfaces to be increased. Therefore, a highly reliable connection can be achieved.

Furthermore, since the thickness of the anisotropic conductive film for use in connecting the first electrode terminal of the panel with the second electrode terminal on the flexible printed circuit board is set at a value approximately equal to the outer diameter of the conductive particle, the conductive particles in the anisotropic conductive film do not flow in the thermocompression bonding process. Therefore, the required amount of conductive particles can be ensured between the first electrode terminal on the side of the panel and the second electrode terminal on the side of the flexible printed circuit board, with which the conductive particles can be prevented from flowing into the space portion between the adjoining electrode terminals on the side of the flexible printed circuit board, and the possible occurrence of current leak can be prevented.

In other words, according to the present embodiment, a panel assembly structure capable of achieving a highly reliable connection can be achieved even when the first and second electrode terminals have a fine pitch.

According to the panel assembly structure of one embodiment, the protrusion amount of the second electrode terminal which is connected with the drive IC provided for driving the panel as mounted on the flexible printed circuit board and connected with the first electrode terminal of the panel, and the protrusion amount of the third electrode terminal which is connected with the fourth electrode terminal of the wiring board each from the surface of the flexible printed circuit board are each set at a value not greater than 10×10⁻³ mm, and the thickness of the anisotropic conductive film used for the connection is set at a value approximately equal to the outer diameter of the conductive particle. With the above-mentioned arrangement, when the first through fourth electrode terminals have a fine pitch in connecting the panel with the flexible printed circuit board and connecting the flexible printed circuit board with the wiring board, a highly reliable connection can be achieved.

According to the panel assembly structure of one embodiment, the second and third electrode terminals formed on the flexible printed circuit board are formed while being embedded in the flexible printed circuit board, thereby putting the surfaces of the second and third electrode terminals in parallel with the substrate surface. Therefore, the protrusion amount from the substrate can be set at a value not greater than 10×10⁻³ mm without reducing the actual thicknesses of the second and third electrode terminals on the flexible printed circuit board.

Therefore, according to the present embodiment, the second and third electrode terminals on the flexible printed circuit board are allowed to have a protrusion amount from the flexible printed circuit board much smaller than that in the conventional case while keeping a rigidity, for which the electrode terminals are not destroyed by a stress or the like generated in connecting the drive IC with the second and third electrode terminals.

According to the panel assembly structure of one embodiment, the second and third electrode terminals formed on the flexible printed circuit board are formed by filling the space between the second electrode terminals and the space between the third electrode terminals on the flexible printed circuit board with the insulating film, thereby putting the top surfaces of the second and third electrode terminals in parallel with the substrate surface of the flexible printed circuit board. With the above-mentioned arrangement, the second and third electrode terminals on the flexible printed circuit board, of which protrusion amount from the flexible printed circuit board is set at a value not greater than 10×10⁻³ mm, can be easily formed without reducing the actual thicknesses of the second and third electrode terminals.

According to the panel assembly structure of one embodiment, the second and third electrode terminals on the flexible printed circuit board are provided with a metal plating. With the above-mentioned arrangement, the second and third electrode terminals on the flexible printed circuit board can be prevented from being oxidized.

Therefore, according to the present embodiment, a more highly reliable connection can be achieved.

According to the panel assembly structure of one embodiment, a metal plating and an insulating film having a thickness equal to the thickness of the metal plating are alternately formed on each electrode terminal on the flexible printed circuit board, and the area of the metal plating and the area of the insulating film are arranged mutually reversely in position to be staggered between adjoining electrode terminals, where the area of the metal plating and the area of the insulating film exhibit a checkered pattern. With the above-mentioned arrangement, the area of the metal plating and the area of the insulating film are adjacent to each other at the adjoining electrode terminals. Therefore, according to the present embodiment, the possible occurrence of current leak due to the conductive particles in the anisotropic conductive film between the adjoining electrode terminals on the flexible printed circuit board can be more surely prevented.

According to the panel assembly structure of one embodiment, the connection of the second electrode terminal on the flexible printed circuit board with the first electrode terminal on the panel, the connection of the second electrode terminal on the flexible printed circuit board with the fifth electrode terminal of the drive use integrated circuit, the connection of the third electrode terminal on the flexible printed circuit board with the fourth electrode terminal on the wiring board, and the connection of the third electrode terminal on the flexible printed circuit board with the sixth electrode terminal of the drive use integrated circuit are achieved with interposition of an identical anisotropic conductive film. With the above-mentioned arrangement, the connections can be achieved simultaneously in one process.

Therefore, according to the present embodiment, a panel assembly structure capable of reducing the processing cost through reduction in number of processes can be achieved.

Then the following describes another embodiment.

Figure 12:
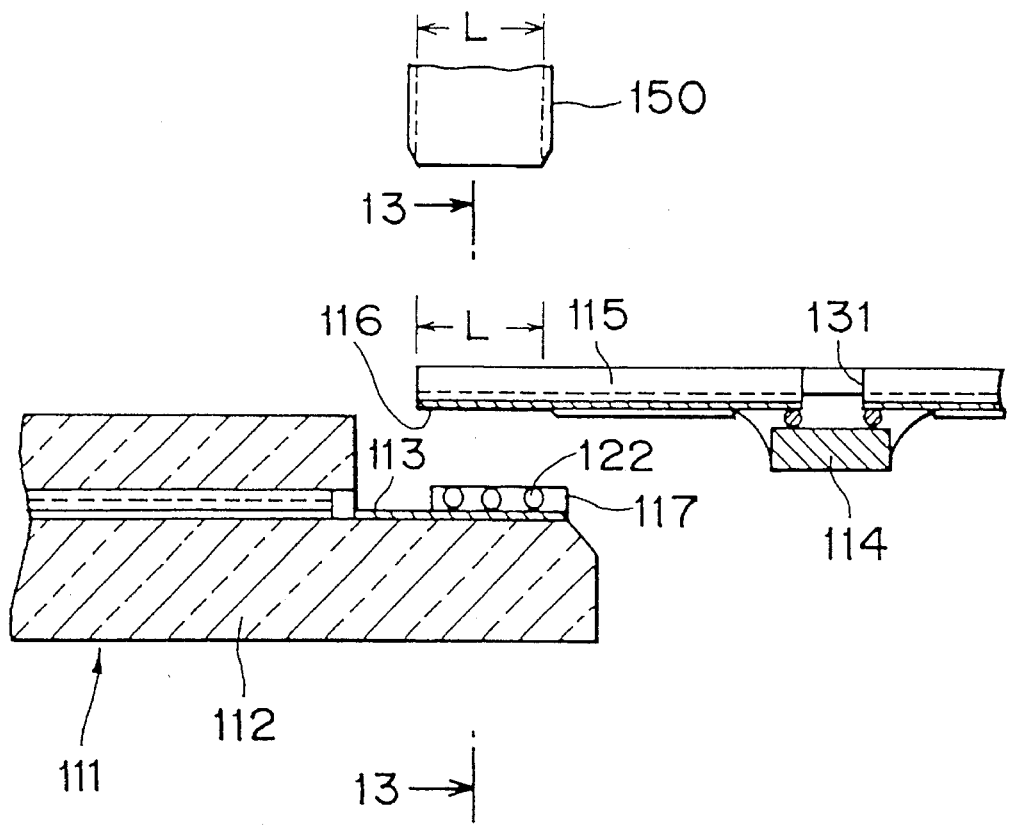
FIG. 12 is a view of a panel and a flexible printed circuit board according to the panel assembly structure of one embodiment of the present invention.
Figure 13:
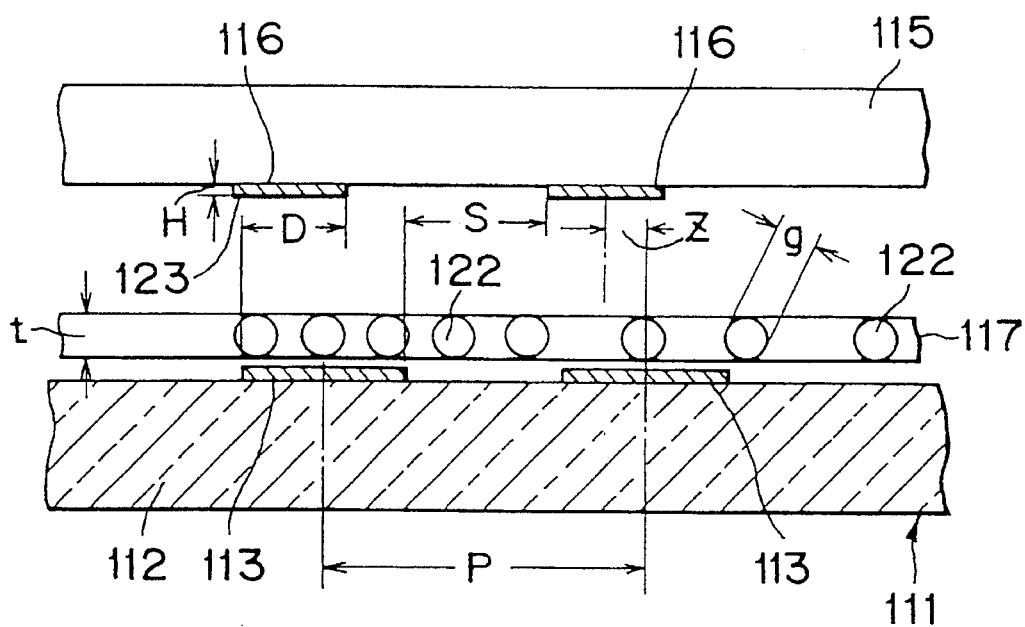
FIG. 13 is a sectional view taken along the line 13—13 in FIG. 12.

FIG. 12 shows a panel and a flexible printed circuit board to be assembled. FIG. 13 shows a sectional view taken along the line 13—13 in FIG. 12. As shown in FIGS. 12 and 13, a plurality of strip-shaped first electrode terminals 113 arranged in parallel with each other at a specified pitch P in a peripheral portion of a glass substrate 112 of a panel 111 are connected via an anisotropic conductive film 117 with strip-shaped second electrode terminals 116 provided on a flexible printed circuit board 115 in correspondence with the first electrode terminals 113 of the panel 111.

As shown in FIG. 12, the flexible printed circuit board 115 is provided with a window 131 which penetrates through the flexible printed circuit board 115, and a drive IC 114 for driving the panel 111 is mounted at the portion of the window 131. The drive IC 114 is connected with a wiring line patterned by etching, and an end portion of the wiring line serves as the second electrode terminal 116.

In the above case, as shown in FIG. 13, a parameter important for the connection between the fine-pitch first electrode terminal 113 and the second electrode terminals 116, i.e., the height (protrusion amount) of the second electrode terminal 116 protruding from a substrate surface 123 in a mesa form is assumed to be H (mm). It is to be noted that the thickness of the first electrode terminal 113 on the side of the panel 111 is set at a value sufficiently smaller than the thickness of the second electrode terminal 116 on the side of the flexible printed circuit board 115. By taking into account a displacement amount Z (mm) between the panel 111 and the flexible printed circuit board 115, it is assumed that the width of a portion where the first and second electrode terminals 113 and 116 actually overlap each other in the lengthwise direction of the electrode terminals is L (mm), (refer to FIG. 12) and the width of a portion where the first and second electrode terminals 113 and 116 actually overlap each other in a direction perpendicular to the lengthwise direction (referred to as the pitchwise direction) is D (mm) in the condition where the electrode terminals are connected with each other. It is further assumed that the amount of conductive particles 122 existing in a unit area of the anisotropic conductive film 117 is N (pieces/mm²).

Figure 14:
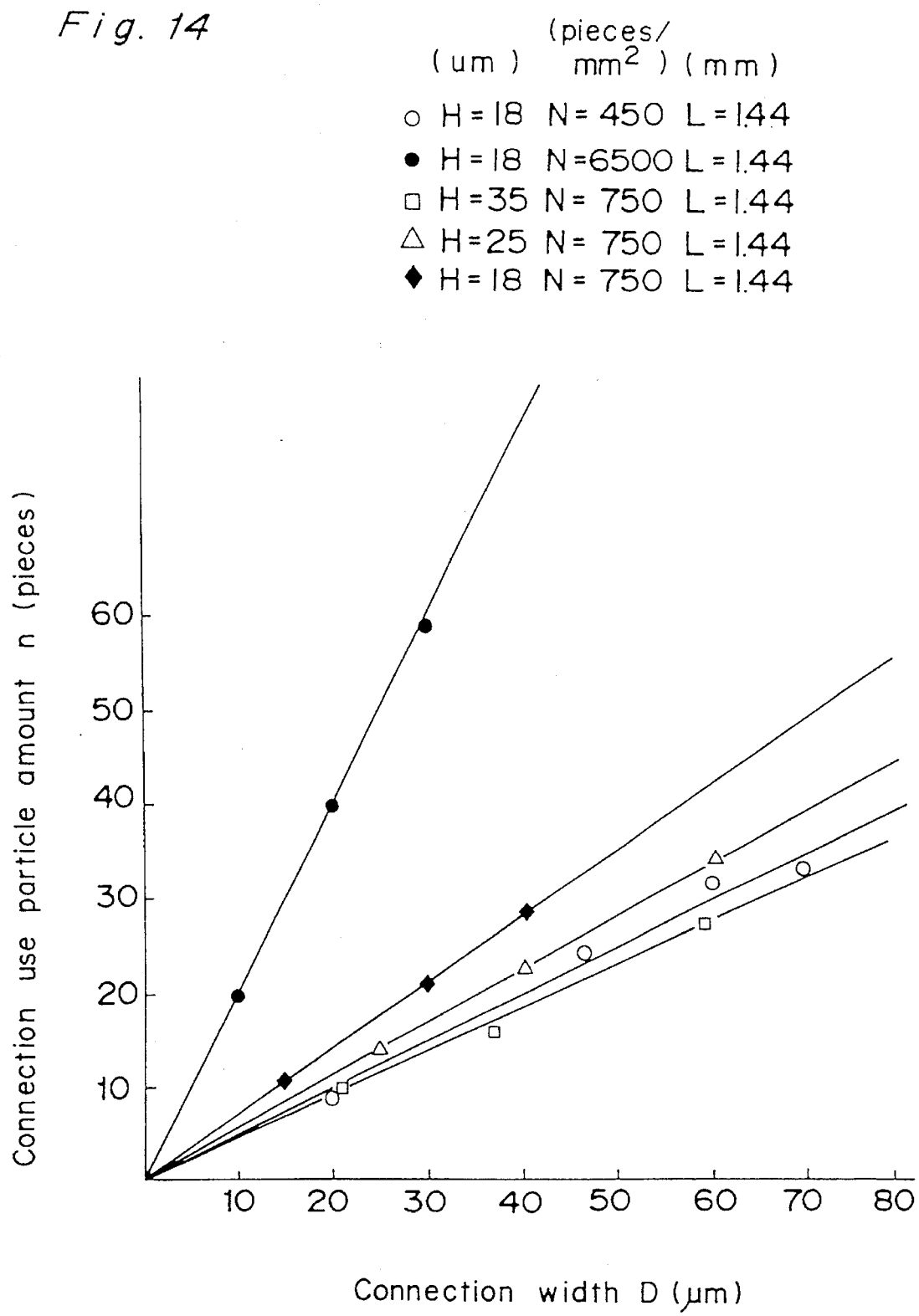
FIG. 14 is a graph showing a relationship between a connection use conductive particle amount n and a connection width D.

When the amount of conductive particles 122 of the anisotropic conductive film 117 existing within an area D·L where the first and second electrode terminals 113 and 116 actually overlap each other when the electrode terminals are connected with each other is n (pieces), it has been discovered from a variety of experiments that the equation:

$$n = \alpha(\beta H + 1) \cdot N^{1/2} \cdot D \cdot L \qquad (1)$$

holds (where $\alpha$ and $\beta$ are constants depending on such conditions as the material characteristics of the anisotropic conductive film, a pressure force in the connecting process, and a temperature). For instance, when it is assumed that the connection width in the lengthwise direction of the terminal L=1.44 mm with the values of H and N set at a variety of values as parameters, there can be obtained a certain linear relationship between n and D according to the values of H and N (for the sake of convenience, H and D are expressed in units of μm in FIGS. 14 and 15). In the present example, $\alpha$=0.0243 ((pieces)$^{1/2}$/mm), and $\beta$=–0.015 (1/mm). In FIG. 14, denotations of marks are as follows.

Figure 15:
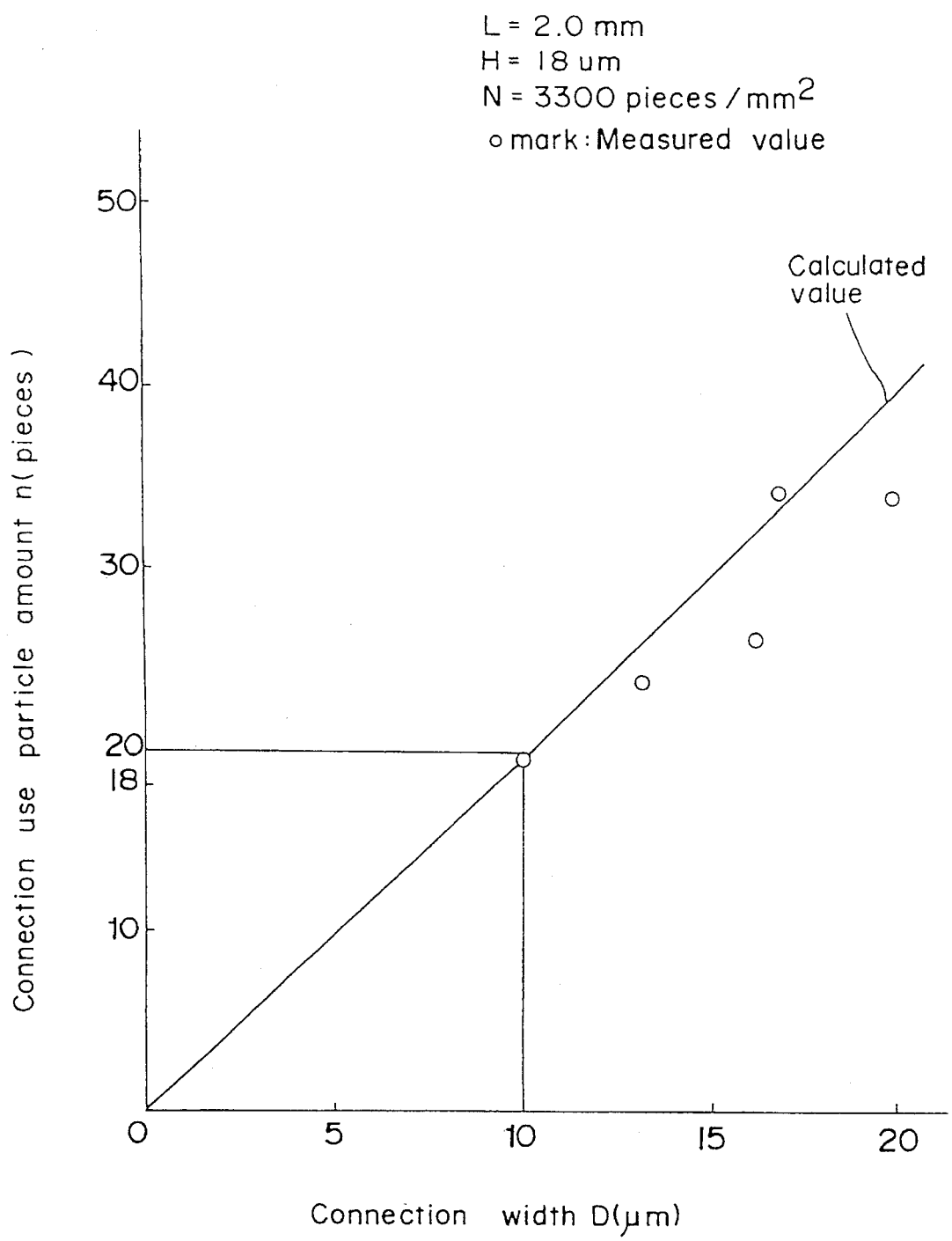
FIG. 15 is a graph showing a relationship between a connection use conductive particle amount n and a connection width D.

○: Relationship of Equation (1)
   when H=18 μm and N=450 pieces/mm$^2$
●: Relationship of Equation (1)
   when H=18 μm and N=6500 pieces/mm$^2$
□: Relationship of Equation (1)
   when H=35 μm and N=750 pieces/mm$^2$
△: Relationship of Equation (1)
   when H=25 μm and N=750 pieces/mm$^2$
◆: Relationship of Equation (1)
   when H=18 μm and N=750 pieces/mm$^2$ As shown in FIG. 15, it can be understood that Equation (1) is in close correspondence with the values obtained from the experiment newly conducted for the present invention. In FIG. 15, the relationship of Equation (1) in the case where the connection width L in the lengthwise direction of the terminal is L=2.0 mm, H=18 μm, and N=3300 pieces/mm$^2$ is represented by the "o" mark. The connection width L in the lengthwise direction of the terminal depends on the durability of a heater tool 50 for applying pressure and heat, and therefore the same value as the present tool width L=2.0 mm is adopted this time.

According to Equation (1), each parameter is set through the following procedure.

(1) First of all, according to a geometrical relationship as shown in FIG. 13 between a connection error (displacement amount) Z, a pitch P of electrode terminals, a connection width D in the pitchwise direction, and a minimum insulation width S, the relational expression:

$$Z=[P-(D+S)]/2 \qquad (3)$$

holds.

In the above place, the connection error Z depends on a mechanical error of an automatic connecting apparatus and other factors, and practically the value $Z=17.5\times10^{-3}$ mm. The pitch P is determined to be, for example, $P=50\times10^{-3}$ mm as an intended specification of the panel. The minimum insulation width S depends on the resin characteristics of the anisotropic conductive film 117, and defines the minimum value of the distance between the edge of one electrode terminal 113 on the side of the panel 111 and the second electrode terminal 116 on the side of the flexible printed circuit board 115 corresponding to the adjacent electrode terminal 113. When the minimum insulation width S is determined to be $S=10\times10^{-3}$ mm, the minimum connection width D in the pitchwise direction is $D=5\times10^{-3}$ mm according to Equation (3).

(2) In order to achieve a connection pitch $P=50\times10^{-3}$ mm, the amount n of conductive particles existing in the connection area D·L (connection use conductive particle amount) serves as an important parameter. According to the results of a variety of experiments, it has been found that the connection use conductive particle amount n capable of ensuring a high connection reliability is not less than five (preferably not less than ten). Therefore, it is required for the connection use conductive particle amount n to be not less than five even in the case of the minimum connection width $D=5\times10^{-3}$ mm.

(3) FIG. 16A shows a table of values of the connection use conductive particle amount n when $\alpha$=0.0243 ((pieces)$^{1/2}$/mm), $\beta$=–0.015 (1/mm), the minimum connection width D in the pitchwise direction is $D=5\times10^{-3}$ mm, and the connection width L in the lengthwise direction is L=2.0 mm with H and N set at a variety of values in Equation (1). It can be understood from the table that not less than five connection use conductive particle amount n can be ensured within a range in which $H=1\times10^{-3}$ to $15\times10^{-3}$ mm and N=1000 to 5000 pieces/mm$^2$.

However, the values of $\alpha$ and $\beta$ have variations due to a statistical error. Therefore, the values of $\alpha$ and $\beta$ are determined, so that the connection use conductive particle amount n takes its minimum value, to be the values as follows:

$\alpha$=0.015 (units: (pieces)$^{1/2}$/mm), and $\beta$=–0.005 (units: 1/mm)

within the ranges of:

$0.015 \leq \alpha \leq 0.035$ (units: (pieces)$^{1/2}$/mm), and $-0.005 \geq \beta \geq -0.025$ (units: 1/mm).

In the present case, the connection use conductive particle amount n when the minimum connection width D in the pitchwise direction is $D=5\times10^{-3}$ mm, and the connection width L in the lengthwise direction is L=2.0 mm with H and N set at a variety of values takes the values as shown in FIG. 16B. It can be understood from FIG. 16B that not less than five connection use conductive particle amount n can be ensured when the values of H and N are respectively within the range of $H=1\times10^{-3}$ to $10\times10^{-3}$ mm and within the range of N=3000 to 5000 pieces/mm$^2$. It is to be noted that the value of H may be not greater than $1\times10^{-3}$ mm.

As described above, in order to achieve the connection pitch $P=50\times10^{-3}$ mm, it is required for n, H and N to be set at respectively specified values so as to satisfy Equation (1).

It can be considered that the protrusion amount H of the second electrode terminal 116 from the surface of the flexible printed circuit board may be not smaller than $10\times10^{-3}$ mm when the amount N of the conductive particles existing in a unit area of the anisotropic conductive film 117 as shown in FIG. 13 is increased. However, when such an arrangement is adopted, the amount of the conductive particles 122 flowing into the space between the second electrode terminals 116 and 116 increases, which is not preferable for the reason that it causes current leak between the second electrode terminals 116 and 116. In other words, it is most preferable to set the value of N at the necessary minimum value.

Then the thickness t of the anisotropic conductive film 117 used for the connection is determined.

Figure 17:
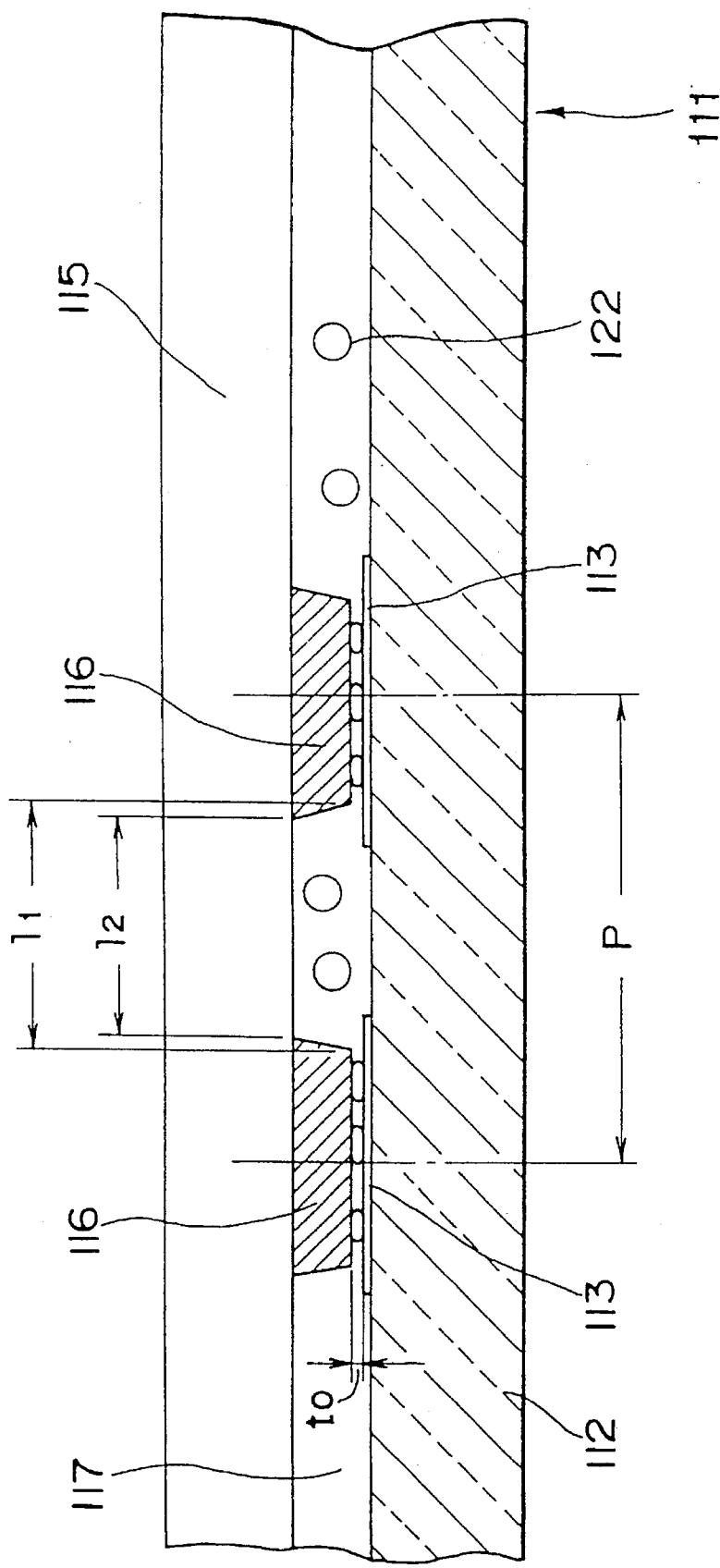
FIG. 17 is a view showing a condition in which a panel is connected with a flexible printed circuit board.

As shown in FIG. 13, it is assumed that the anisotropic conductive film 117 has a uniform thickness t before it is used for the connection. Further, as shown in FIG. 17, it is assumed that the anisotropic conductive film 117 has a thickness $t_0$ after it is used for the connection between the first electrode terminal 113 and the second electrode terminal 116. It is preferred for the thickness $t_0$ to be set at a value equal to the diameter of the conductive particles 122 as apparent from the embodiment shown in FIG. 12.

Assuming that the distance between the mesa-shaped shoulders of adjoining second electrode terminals 116 and 116 on the substrate surface of the flexible printed circuit board 115, i.e., the distance between the edges of the top surfaces is $I_1$, and the distance between the adjoining second electrode terminals 116 and 116 on the surface of the flexible printed circuit board is $I_2$, then the relational expression:

$$t=(I_1+I_2)\cdot H/(2\cdot P)+t_0+\gamma \quad (2)$$

holds according to a geometrical relationship (where γ is a constant depending on such conditions as the material characteristics of the anisotropic conductive film, a pressure force in the connecting process, and a temperature). By substituting the already set value of protrusion amount H into Equation (2), a set value of t is determined. The value of γ is set within the range of:

$$0 \leq \gamma \leq 9.0 \text{ (units: } 10^{-3} \text{ mm).}$$

With the above-mentioned arrangement, the flow of the resin of the anisotropic conductive film 117 can be suppressed to the necessary minimum value in the thermocompression bonding process, The above-mentioned arrangement can also prevent the possible occurrence of current leak due to the cohesion of the conductive particles 122 in the space portion between adjoining second electrode terminals 116 and 116. As a result, an improved connection reliability can be achieved.

Figure 18:
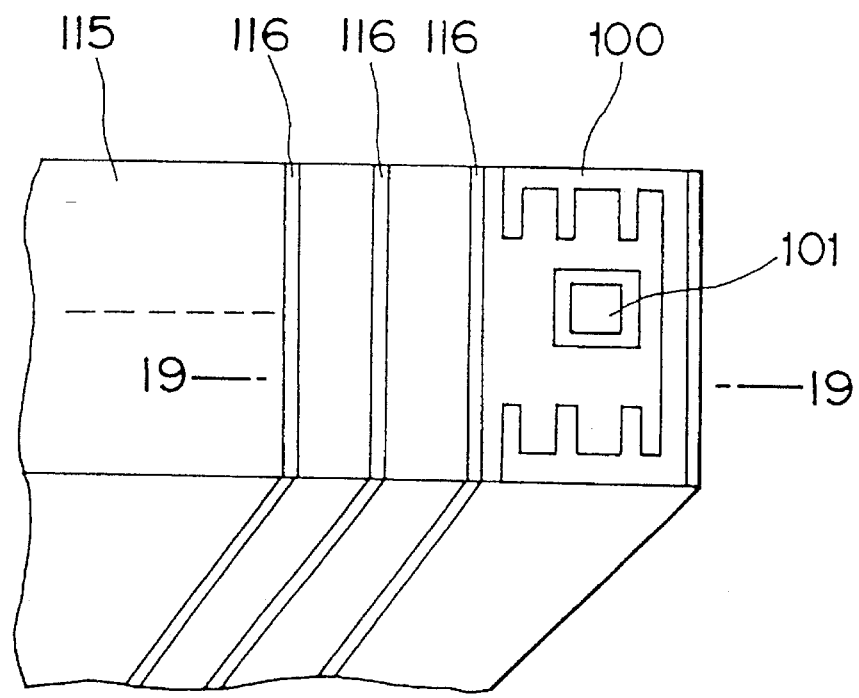
FIG. 18 is a view of a dummy electrode terminal provided in an end portion of an array of electrode terminals of a flexible printed circuit board.
Figure 19:
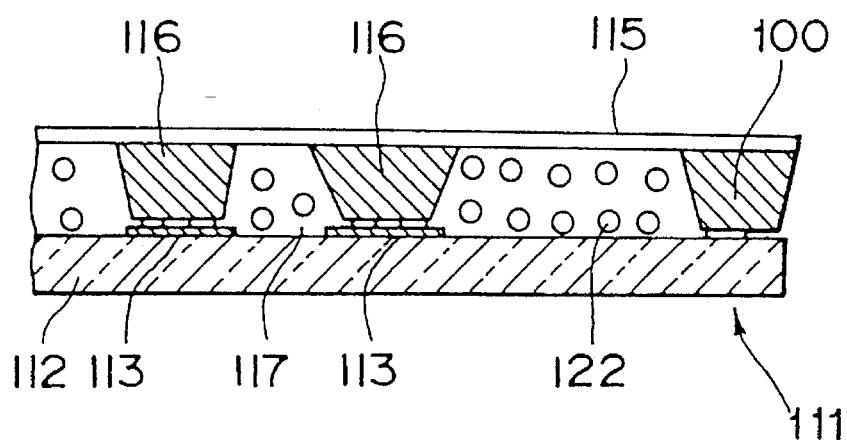
FIG. 19 is a sectional view taken along the line 19—19 in FIG. 18.
Figure 20:
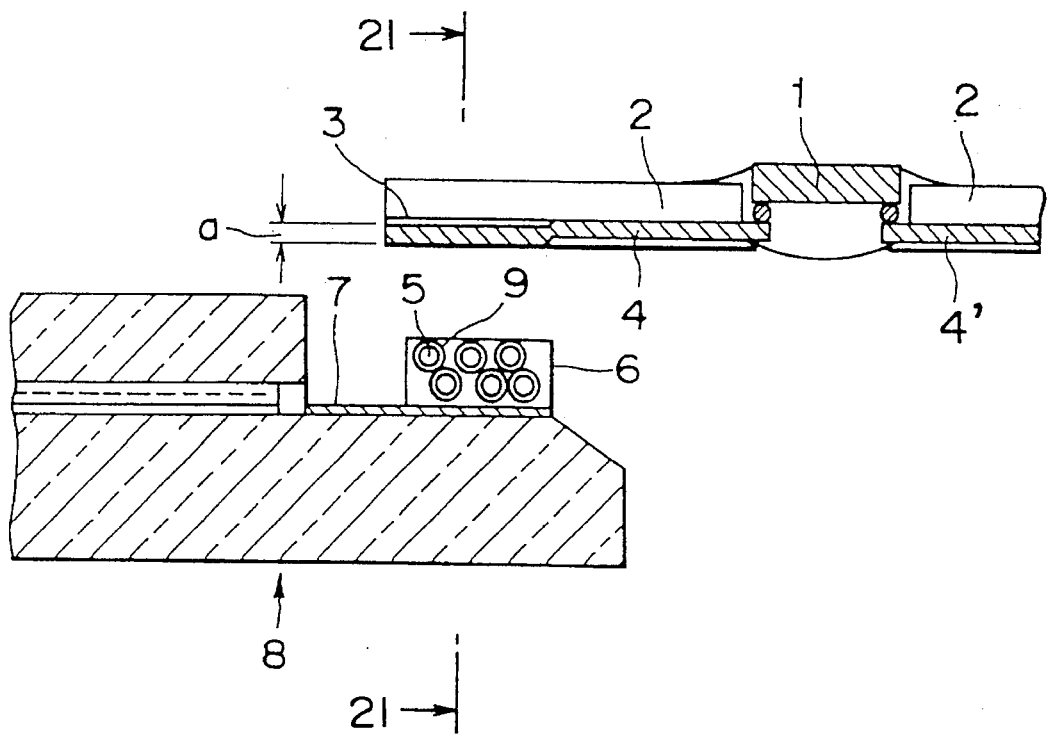
FIG. 20 is a view showing a panel and a flexible printed circuit board according to a conventional panel assembly structure.
Figure 21:
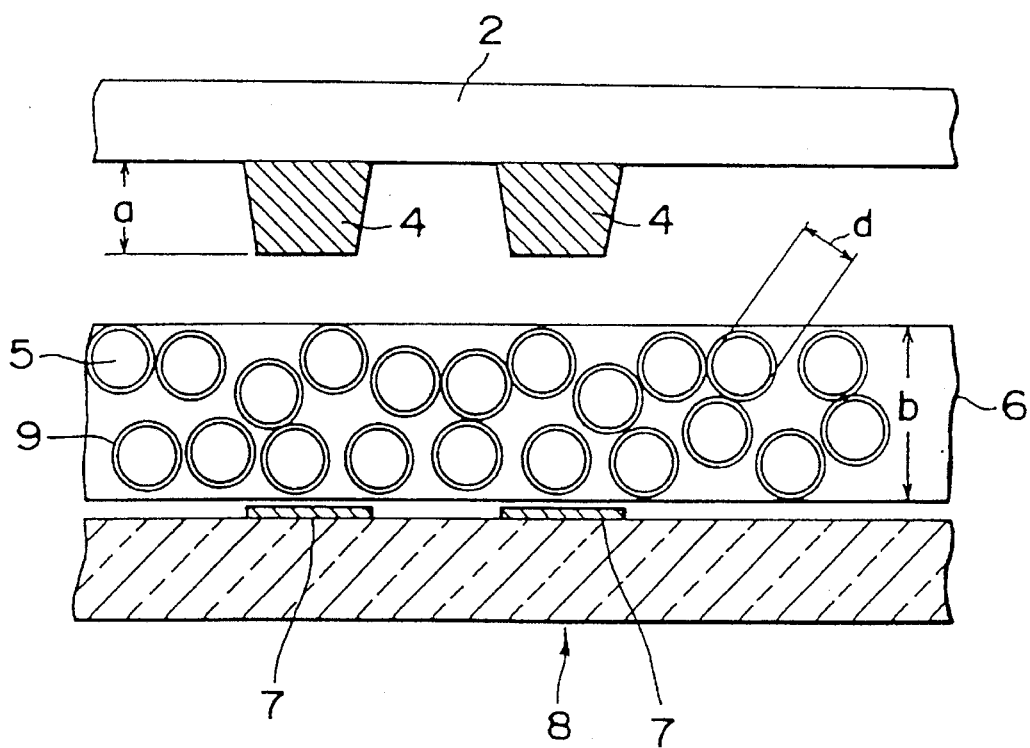
FIG. 21 is a sectional view taken along the line 21—21 in FIG. 20.
Figure 22:
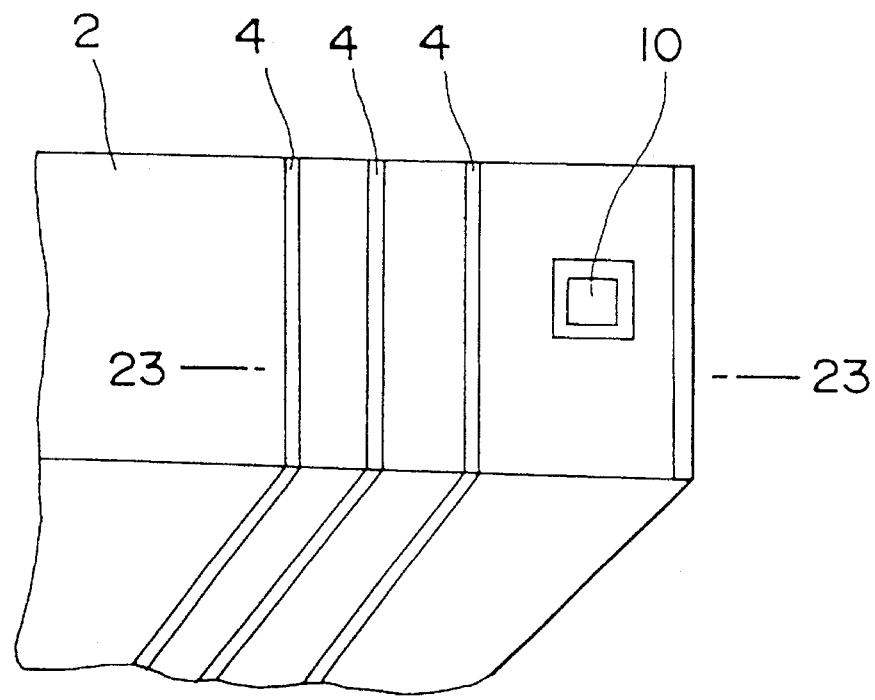
FIG. 22 is a view showing an end portion of an array of electrode terminals of a flexible printed circuit board employed in the conventional panel assembly structure.
Figure 23:
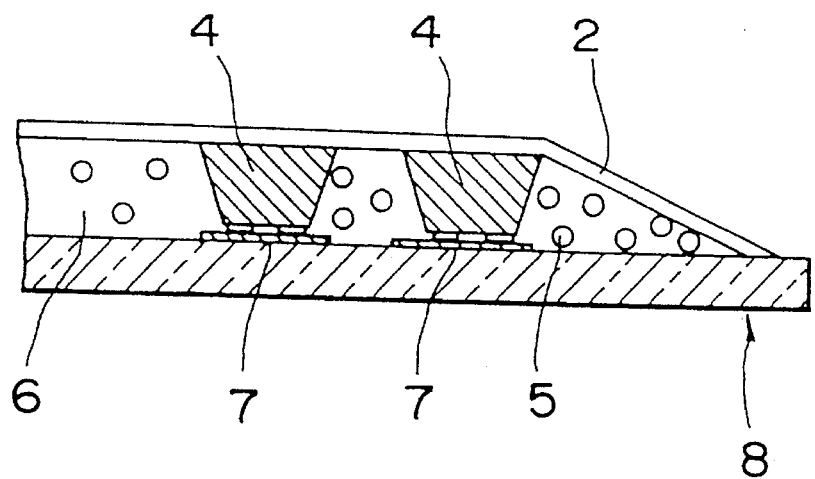
FIG. 23 is a sectional view taken along the line 23—23 in FIG. 22.

FIG. 18 shows an example in which a dummy electrode terminal 100 which has an approximately bracket-shaped pattern and is opening toward the second electrode terminal 116 is provided at an end portion of an array of the second electrode terminals 116, 116, . . . of the flexible printed circuit board 115. Inside the approximately bracket-shaped pattern is provided an alignment mark 101 for alignment in position with the panel. The dummy electrode terminal 100 is in no correspondence with the first electrode terminal 113 of the panel 111 as shown in FIG. 19. When the dummy electrode terminal 100 is provided on the flexible printed circuit board 115, the resin of the anisotropic conductive film 117 at the end portion of the flexible printed circuit board 115 can be prevented from flowing out in the connection process. Therefore, the anisotropic conductive film 117 can be filled in a uniform thickness between the panel 111 and the flexible printed circuit board 115 to allow the connection reliability to be improved. Even in the above-mentioned case, it is most preferable to set the height of the second electrode terminal at a value not greater than $10 \times 10^{-3}$ mm and set the film thickness of the anisotropic conductive film 117 at a value approximately equal to the outer diameter of the conductive particle 122.

According to the panel assembling method of the aforementioned embodiment, a panel assembly structure which has a high connection reliability even when fine-pitch electrode terminals are employed is achieved.

Furthermore, the values of the constants α, β, and γ are set within the ranges of:

$$0.015 \leq \alpha \leq 0.035 \text{ (units: (pieces)}^{1/2}\text{/mm),}$$

$$-0.005 \geq \beta \geq -0.025 \text{ (units: 1/mm), and}$$

$$0 \leq \gamma \leq 9.0 \text{ (units: } 10^{-3} \text{ mm),}$$

and therefore the parameters H and N in Equation (1) can be set depending on such actual conditions as the material characteristics of the practical anisotropic conductive film, a pressure force in the connecting process, and a temperature.

Furthermore, according to the aforementioned panel assembling method, the value of n is set within the range of:

$$5 \leq n,$$

and therefore the required connection use conductive particle amount n can be ensured within the area D·L where the first and second electrode terminals actually overlap each other when the electrode terminals are connected.

Furthermore, according to the panel assembly structure of the aforementioned embodiment, the dummy electrode terminal which has an approximately bracket-shaped pattern, and is opening toward the second electrode terminal while being in no correspondence with the first electrode terminal of the panel is provided at the end portion of the array of the second electrode terminals of the flexible printed circuit board. With the above-mentioned arrangement, the resin of the anisotropic conductive film at the end portion of the flexible printed circuit board can be prevented from flowing out in the connection process. Therefore, the anisotropic conductive film can be filled in a uniform thickness between the panel and the flexible printed circuit board, which consequently allows the connection reliability to be improved.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A panel assembly structure in which a first electrode terminal formed in a peripheral portion of one surface of a substrate of a panel is connected via an anisotropic conductive film with a second electrode terminal which is formed on a flexible printed circuit board mounted with a drive use integrated circuit for driving the panel and connected with the drive use integrated circuit, wherein a height of the second electrode terminal on the flexible printed circuit board from a surface of the flexible printed circuit board is set at a value of not greater than $10 \times 10^{-3}$ mm, and a film thickness of the anisotropic conductive film is set at a value approximately equal to an outer diameter of each conductive particle existing in the anisotropic conductive film.

2. The panel assembly structure as claimed in claim 1, wherein a third electrode terminal which is formed on the flexible printed circuit board and connected with the drive use integrated circuit is connected via an anisotropic conductive film with a fourth electrode terminal of a wiring board for transmitting an external signal to the drive use integrated circuit, a height of the third electrode terminal formed on the flexible printed circuit board from the surface of the flexible printed circuit board is set at a value of not greater than $10 \times 10^{-3}$ mm, and a film thickness of the anisotropic conductive film for use in connecting the third electrode terminal is set at a value approximately equal to an outer diameter of each conductive particle existing in the anisotropic conductive film.

3. The panel assembly structure as claimed in claim 2, wherein the second and third electrode terminals formed on the flexible printed circuit board are formed while being embedded in the flexible printed circuit board, and top surfaces of the second and third electrode terminals are arranged in parallel with the surface of the flexible printed circuit board.

4. The panel assembly structure as claimed in claim 2, wherein the second and third electrode terminals on the flexible printed circuit board are provided with a metal plating.

5. A panel assembly structure as claimed in claim 4, wherein the metal plating of the second and third electrode terminals on the flexible printed circuit board is achieved in a manner that only limited areas which belong to the second and third electrode terminals and are to be connected respectively with the first electrode terminal on the panel and the fourth electrode terminal of the wiring board are provided with a metal plating, and other areas which belong to the second and third electrode terminals and are to be connected neither with the first electrode terminal on the panel nor with the fourth electrode terminal of the wiring board are covered with an insulating film.

6. A panel assembly structure as claimed in claim 4, wherein the metal plating of the second and third electrode terminals on the flexible printed circuit board is achieved in a manner that the second and third electrode terminals are each provided alternately with the metal plating and an insulating film having a thickness equal to a thickness of the metal plating in a lengthwise direction of each of the electrode terminals, and an area of the metal plating and an area of the insulating film are arranged mutually reversely in position to be staggered between adjoining second electrode terminals and between adjoining third electrode terminals, whereby the area of the metal plating and the area of the insulating film provided on a plurality of second electrode terminals arranged in parallel with each other and on a plurality of third electrode terminals arranged in parallel with each other on the flexible printed circuit board cooperatively constitute a checkered pattern.

7. A panel assembly structure as claimed in claim 2, wherein connection of the second electrode terminal on the flexible printed circuit board with the first electrode terminal on the panel, connection of the second electrode terminal on the flexible printed circuit board with a fifth electrode terminal of the drive use integrated circuit, connection of the third electrode terminal on the flexible printed circuit board with the fourth electrode terminal on the wiring board, and connection of the third electrode terminal on the flexible printed circuit board with a sixth electrode terminal of the drive use integrated circuit are achieved with interposition of an identical anisotropic conductive film.

8. The panel structure as claimed in claim 2, wherein the film thickness value is the value before the panel is connected.

9. The panel assembly structure as claimed in claim 1, wherein the second electrode terminal formed on the flexible printed circuit board is formed while being embedded in the flexible printed circuit board, and a top surface of the second electrode terminal is arranged in parallel with the surface of the flexible printed circuit board.

10. A panel assembly structure as claimed in claim 1, wherein the second electrode terminal formed on the flexible printed circuit board is formed while protruding only a top portion thereof from an insulating film filled between the second electrode terminals, and a top surface of the second electrode terminal is arranged in parallel with the surface of the flexible printed circuit board.

11. The panel assembly structure as claimed in claim 1, wherein the second electrode terminal on the flexible printed circuit board is provided with a metal plating.

12. A panel assembly structure as claimed in claim 11, wherein the metal plating of the second electrode terminal on the flexible printed circuit board is achieved in a manner that all protruding portions of the second electrode terminals on the flexible printed circuit board are provided with a metal plating.

13. A panel assembly structure as claimed in claim 11, wherein the metal plating of the second electrode terminal on the flexible printed circuit board is achieved in a manner that each of the second electrode terminals is provided alternately with the metal plating and an insulating film having a thickness equal to a thickness of the metal plating in a lengthwise direction of the second electrode terminal, and an area of the metal plating and an area of the insulating film are arranged mutually reversely in position to be staggered between adjoining second electrode terminals, whereby the area of the metal plating and the area of the insulating film on a plurality of second electrode terminals arranged in parallel with each other on the flexible printed circuit board cooperatively constitute a checkered pattern.

14. A panel assembly structure as claimed in claim 1, wherein a plurality of the first electrode terminals are arranged at a pitch P (units:mm), and assuming that a height of the second electrode terminal protruding from the surface of the flexible printed circuit board is H (units:mm) and an amount of conductive particles existing in a unit area of the anisotropic conductive film is N, that a width of a portion where the first and second electrode terminals actually overlap each other in a lengthwise direction of the electrode terminals is L (units:mm) and a width of a portion where the first and second electrode terminals actually overlap each other in a direction perpendicular to the lengthwise direction is D (units:mm) in a condition where the first electrode terminal and the second electrode terminal are connected with each other, and that an amount of the conductive particles existing in the anisotropic conductive film within the portion where the first and second electrode terminals actually overlap each other in the condition where the first and second electrode terminals are connected with each other is n, then values of n, H, and N are set so as to satisfy a relational expression:

$$n = \alpha(\beta H + 1) \cdot N^{1/2} \cdot D \cdot L \qquad (1)$$

(where $\alpha$ and $\beta$ are constants depending on such conditions as material characteristics of the anisotropic conductive film, a pressure force in a connecting process, and a temperature), and the values $\alpha$ and $\beta$ are set respectively within the ranges of:

$0.015 \leq \alpha \leq 0.035$ (units: (pieces)$^{1/2}$/mm), and $-0.005 \geq \beta \geq -0.025$ (units: 1/mm).

15. A panel assembly structure as claimed in claim 14, wherein the value of n is set within the range of:

$5 \leq n$.

16. A panel assembly structure as claimed in claim 1, wherein a dummy electrode terminal which has an approximately bracket-shaped pattern and is opening toward the second electrode terminal while being in no correspondence with the first electrode terminal of the panel is provided beside an end portion of an array comprised of the second electrode terminal of the flexible printed circuit board.

17. The panel assembly structure as claimed in claim 1, wherein the conductive particles have a diameter set at a value of 1 to 3×10$^{-3}$ mm.

18. The panel assembly structure as claimed in claim 1, wherein the second electrode terminal protrudes from the surface of the printed circuit board in a range of 0 to 2×10–3 mm.

19. The panel structure as claimed in claim 1, wherein the film thickness value is the value before the panel is connected.

20. A panel assembly structure ill which a plurality of strip-shaped first electrode terminals arranged at a specified pitch P (units:mm) in a peripheral portion of a panel are connected via an anisotropic conductive film with strip-shaped second electrode terminals provided on a flexible printed circuit board in correspondence with the first electrode terminals, wherein, assuming that a height of the second electrode terminals protruding from a surface of the flexible printed circuit board is H (units:mm) and an amount of conductive particles existing in a unit area of the anisotropic conductive film is N, that a width of a portion where the first and second electrode terminals actually overlap each other in a lengthwise direction of the electrode terminals is L (units:mm) and a width of the portion where the first and second electrode terminals actually overlap each other in a direction perpendicular to the lengthwise direction is D (units:mm) in a condition where the first electrode terminal and the second electrode terminal are connected with each other, and that an amount of the conductive particles existing in the anisotropic conductive film within the portion where the first and second electrode terminals actually overlap each other in the condition where the first and second electrode terminals are connected with each other is n, then values of n, H, and N are set so as to satisfy a relational expression:

$n = \alpha(\beta H + 1) \cdot N^{1/2} \cdot D \cdot L$ (1)

(where $\alpha$ and $\beta$ are constants depending on such conditions as material characteristics of the anisotropic conductive film, a pressure force in a connecting process, and a temperature), and assuming that a uniform thickness of the anisotropic conductive film before the film is used for the connection between the first electrode terminals and the second electrode terminals is t (units:mm) and a thickness of the anisotropic conductive film achieved after the film is used for the connection between the first and second electrode terminals is $t_0$ (units:mm), and that a distance between edges of top surfaces of adjoining second electrode terminals on the surface of the flexible printed circuit board is $l_1$ (units:mm) and a distance between the adjoining second electrode terminals on the surface of the flexible printed circuit board is $l_2$ (units:mm), then a value of C is set so as to satisfy a relational expression:

$t = (l_1 + l_2) \cdot H/(2 \cdot P) + t_0 + \gamma$ (2)

(where $\gamma$ is a constant depending on such conditions as material characteristics of the anisotropic conductive film, a pressure force in a connecting process, and a temperature), and values of $\alpha$, $\beta$, and $\gamma$ are set respectively within the ranges of:

$0.015 \leq \alpha \leq 0.035$ (units: (pieces)$^{1/2}$/mm), $-0.005 \geq \beta \geq -0.025$ (units: 1/mm), and $0 \leq \gamma \leq 9.0$ (units: 10$^{-3}$ mm).

21. A panel assembly structure as claimed in claim 20, wherein the value of n is set within the range of:

$5 \leq n$.

22. A panel assembling method for connecting via an anisotropic conductive film a plurality of strip-shaped first electrode terminals arranged at a specified pitch P (units:mm) in a peripheral portion of a panel with strip-shaped second electrode terminals provided on a flexible printed circuit board in correspondence with the first electrode terminals, wherein, assuming that a height of the second electrode terminals protruding from a surface of the flexible printed circuit board is H (units:mm) and an amount of conductive particles existing in a unit area of the anisotropic conductive film is N, that a width of a portion where the first and second electrode terminals actually overlap each other in a lengthwise direction of the electrode terminals is L (units:mm) and a width of the portion where the first and second electrode terminals actually overlap each other in a direction perpendicular to the lengthwise direction is D (units:mm) in a condition where the first electrode terminal and the second electrode terminal are connected with each other, and that an amount of the conductive particles existing in the anisotropic conductive film within the portion where the first and second electrode terminals actually overlap each other in the condition where the first and second electrode terminals are connected with each other is n, then the panel assembling method comprises the step of:

setting values of n, H, and N so as to satisfy a relational expression:

$n = \alpha(\beta H + 1) \cdot N^{1/2} \cdot D \cdot L$ (1)

while setting values $\alpha$ and $\beta$ respectively within the ranges of:

$0.015 \leq \alpha \leq 0.035$ (units: (pieces)$^{1/2}$/mm), and $-0.005 \geq \beta \geq 0.025$ (units: 1/mm), (where $\alpha$ and $\beta$ are constants depending on such conditions as material characteristics of the anisotropic conductive film, a pressure force in a connecting process, and a temperature), and assuming that a uniform thickness of the anisotropic conductive film before the film is used for the connection between the first electrode terminals and the second electrode terminals is t (units:mm) and a thickness of the anisotropic conductive film achieved after the film is used for the connection between the first and second electrode terminals is $t_0$ (units:mm), and that a distance between edges of top surfaces of adjoining second electrode terminals on the surface of the flexible printed circuit board is $l_1$ (units:mm) and a distance between the adjoining second electrode terminals on the surface of the flexible printed circuit board is $l_2$ (units:mm), then the panel assembling method comprises the step of:

setting a value of t so as to satisfy a relational expression:

$$t = (l_1 + l_2) \cdot H/(2 \cdot P) + t_0 + \gamma \qquad (2)$$

(where $\gamma$ is a constant depending on such conditions as material characteristics of the anisotropic conductive film, a pressure force in a connecting process, and a temperature) while setting a value of $\gamma$ within the range of:

$0 \leq \gamma \leq 9.0$ (units: $10^{-3}$ mm).

23. A panel assembling method as claimed in claim 22, wherein the value of n is set within the range of:

$5 \leq n$.

24. A panel assembly structure in which a first electrode terminal formed in a peripheral portion of one surface of a substrate of a panel is connected via an anisotropic conductive film with a second electrode terminal which is formed on a flexible printed circuit board mounted with a drive use integrated circuit for driving the panel and connected with the drive use integrated circuit, wherein a height of the second electrode terminal on the flexible printed circuit board from a surface of the flexible printed circuit board is set at a value of approximately $10 \times 10^{-3}$ mm, and a film thickness of the anisotropic conductive film is set at a value approximately equal to an outer diameter of each conductive particle existing in the anisotropic conductive film.

25. The panel assembly structure as claimed in claim 24, wherein the conductive particles have a diameter set at a value of 1 to $3 \times 10^{-3}$ mm.

26. The panel assembly structure as claimed in claim 24 wherein the second electrode terminal is embedded in the flexible printed circuit board, and a top surface of the second electrode terminal is parallel with the surface of the printed circuit board and protrudes from the surface of the printed circuit board in a range of 0 to $2 \times 10^{-}$ mm.

* * * * *